United States Patent
Kanapka

(10) Patent No.: US 7,962,317 B1
(45) Date of Patent: Jun. 14, 2011

(54) ANALYTIC LINEARIZATION FOR SYSTEM DESIGN

(75) Inventor: Joseph Daniel Kanapka, Cambridge, MA (US)

(73) Assignee: The Math Works, Inc., Natick, MA (US)

( * ) Notice: Subject to any disclaimer, the term of this patent is extended or adjusted under 35 U.S.C. 154(b) by 611 days.

(21) Appl. No.: 11/879,351

(22) Filed: Jul. 16, 2007

(51) Int. Cl.
*G06F 17/10* (2006.01)

(52) U.S. Cl. ............. 703/2; 703/3; 703/4; 703/5; 703/6; 716/100; 716/106; 716/113; 716/109

(58) Field of Classification Search .............. 703/2, 12, 703/22; 701/67; 716/4; 717/168
See application file for complete search history.

(56) References Cited

U.S. PATENT DOCUMENTS

| | | | |
|---|---|---|---|
| 7,596,474 B2 * | 9/2009 | Langemyr et al. | 703/2 |
| 2003/0018455 A1 * | 1/2003 | Rosenthal | 703/2 |
| 2003/0046050 A1 * | 3/2003 | Padilla et al. | 703/12 |
| 2003/0105614 A1 * | 6/2003 | Langemyr et al. | 703/2 |
| 2004/0034514 A1 * | 2/2004 | Langemyr et al. | 703/2 |
| 2005/0060129 A1 * | 3/2005 | Mosterman et al. | 703/2 |
| 2005/0216248 A1 * | 9/2005 | Ciolfi et al. | 703/22 |
| 2006/0112382 A1 * | 5/2006 | Glass et al. | 717/168 |
| 2007/0073442 A1 * | 3/2007 | Aghili | 700/245 |
| 2007/0157138 A1 * | 7/2007 | Ciolfi et al. | 716/4 |
| 2007/0294017 A1 * | 12/2007 | Joshi et al. | 701/67 |
| 2009/0012754 A1 * | 1/2009 | Mosterman et al. | 703/2 |
| 2009/0187527 A1 * | 7/2009 | Mcaree et al. | 706/52 |

* cited by examiner

*Primary Examiner* — Kamini S Shah
*Assistant Examiner* — Cuong V Luu
(74) *Attorney, Agent, or Firm* — Nelson Mullins Riley & Scarborough LLP; Kevin J. Canning; Nesli I. Doran

(57) ABSTRACT

A method and apparatus may linearize a model representing a dynamic system without using perturbation techniques. The model may include a differential-algebraic system of equations to represent the dynamic system. The mass matrix of the model may be singular. The linear model of the system may be generated in a state-space representation using the analytic Jacobians of the model.

39 Claims, 6 Drawing Sheets

ANALYTIC LINEARIZATION FOR SYSTEM DESIGN

BACKGROUND

The term "dynamic system" (either natural or man-made) may refer to a system whose response at any given time is a function of its input stimuli, its current state, and the current time. Such systems may range from simple to highly complex systems. Examples of dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems may include a bouncing ball, a spring with a mass tied to its end, automobiles, airplanes, control systems in major appliances, communication networks, audio signal processing, nuclear reactors, stock markets, etc.

Professionals from diverse areas such as engineering, science, education, and economics may build mathematical models of dynamic systems in order to better understand system behavior as it changes with the progression of time. The models may aid in building better systems in terms of a variety of performance measures, such as quality, time-to-market, cost, speed, size, power consumption, robustness, etc. The models may also aid in analyzing, debugging, repairing, and predicting performance of existing systems. The models may also serve an educational purpose of educating others on the basic principles governing physical systems. The models and results may often be used as a tool for communicating information about different systems.

The process of linearization may refer to the approximation of complex dynamic system models (i.e., non-linear models) that yields a linear model, which may be used by various engineering analysis tools. After linearization, the approximation of a complex model may be accurate for regions near an operating point. The operating point of a model may define its total "state" at any given time. For example, for a model of a car engine, the operating points may be typically described by variables such as engine speed, throttle angle, engine temperature, and the surrounding atmospheric condition. The behavior or what is typically known as the "dynamics" of the model may be generally affected by the values of the operating points. For example, in a car, the behavior of an engine can greatly vary if the car is being operated in the high elevations of Colorado or the low elevations of Florida.

A model that includes at least one algebraic equation to represent a dynamic system may have a singular mass matrix. A singular matrix refers to a square matrix that does not have a matrix inverse. A mass matrix refers to a matrix that appears in the system equation $M(t,x,u)\dot{x}=F(t,x,u)$, where M is a mass matrix, F is a forcing function, t, x and u are the variables of the system, and $\dot{x}$ is the derivative of the variable x with respect to time.

The standard approach to linearizing a system having a singular mass matrix may result in the descriptor form of:

$$E\dot{x}=Ax+Bu$$

$$y=Cx+Du$$

where u is an input vector, y is an output vector, x is a state vector and A, B, C, D and E are matrices. In the descriptor form, the matrix E may be singular. System designers are often more comfortable working with the following state-space representation.

$$\dot{x}=Ax+Bu$$

$$y=Cx+Du$$

The state-space representation of a system having a singular mass matrix may be obtained by perturbation techniques. The perturbation techniques are a method that is used to find an approximate solution to a problem that cannot be solved exactly. For example, state variables and input variables are first perturbed and then the resulting perturbations to state variable derivatives and output variables are measured in the descriptor form of the system. Based on the measurement, the state-space representation of the system may be obtained. These perturbation techniques, however, are expensive and time-consuming.

SUMMARY

An embodiment of the present invention may provide the linearization of a model representing a dynamic system. The model may include at least one algebraic equation to represent the dynamic system and the mass matrix of the model may be singular. In an embodiment, the model may be linearized using the analytic Jacobians of the model to obtain a state-space representation of the model. The Jacobian refers to the Jacobian matrix. Given a vector valued function $y=f(x)$ where x and y are vectors, the Jacobian matrix is the matrix of all first-order partial derivatives of the vector-valued function. An embodiment may generate the state-space representation of the model without using perturbation techniques.

In accordance with one embodiment, a method is provided for linearizing a model. The method may obtain the model of a system that includes at least one differential-algebraic equation to represent the system. The mass matrix of the model may be singular. The method may also obtain at least one analytic Jacobian of at least a part of the model. The at least a part of the model may be linearized using the at least one analytic Jacobian. The model is saved in a storage element.

In accordance with another embodiment, a computer-readable storage medium is provided for holding instructions for linearizing a model. The instructions, when executed, may obtain the model of a system that includes at least one differential-algebraic equation to represent the system. The mass matrix of the model may be singular. The instructions may also obtain at least one analytic Jacobian of at least a part of the model. The at least a part of the model may be linearized using the at least one analytic Jacobian. The model is saved in a storage element.

In accordance with still another embodiment, an apparatus is provided for linearizing a model. The apparatus may include a processor for generating the linear model of a system in a state-space representation using the analytic Jacobians of a model including a differential-algebraic system of equations to represent the system. The apparatus also includes a storage element for saving the linear model.

In accordance with still another embodiment, a computer-implemented device is provided for linearizing a model. The device may include means for obtaining the model of a system that includes at least one differential-algebraic equation to represent the system. The mass matrix of the model may be singular. The device may also include means for obtaining at least one analytic Jacobian of at least a part of the model. The at least a part of the model may be linearized using the at least one analytic Jacobian. The model is saved in a storage element.

BRIEF DESCRIPTION OF THE DRAWINGS

The present invention will become better understood with reference to the following description and accompanying drawings, wherein.

DETAILED DESCRIPTION

A model that includes at least one algebraic equation to represent a dynamic system may have a singular mass matrix. A singular matrix refers to a square matrix that does not have a matrix inverse. A mass matrix refers to a matrix that appears in the system equation $M(t,x,u)\dot{x}=F(t,x,u)$, where M is a mass matrix, F is a forcing function, t, x and u are the variables of the system, and $\dot{x}$ is the derivative of the variable x with respect to time.

The standard approach to linearizing a system having a singular mass matrix may result in the descriptor form of:

$$E\dot{x}=Ax+Bu$$

$$y=Cx+Du$$

where u is an input vector, y is an output vector, x is a state vector and A, B, C, D and E are matrices. In the descriptor form, the matrix E may be singular. System designers are often more comfortable working with the following state-space representation.

$$\dot{x}=Ax+Bu$$

$$y=Cx+Du$$

The state-space representation of a system having a singular mass matrix may obtained by perturbation techniques. The perturbation techniques are a method that is used to find an approximate solution to a problem that cannot be solved exactly. For example, state variables and input variables are first perturbed and then the resulting perturbations to state variable derivatives and output variables are measured in the descriptor form of the system. Based on the measurement, the state-space representation of the system may be obtained. These perturbation techniques, however, are expensive and time-consuming.

An exemplary embodiment may linearize a model in a computing environment. The model may include a differential algebraic system of equations (DAE) to represent a system, and the mass matrix of the model may be singular. The computing environment may provide or be coupled to a tool that can provide the analytic Jacobians of the model. The analytic Jacobians define the partial derivatives of a vector-valued function with respect to the variables of the function. A linear model of the system may be generated in a state-space representation using the analytic Jacobians.

As such, a user can obtain a linear model in a state-space representation without using perturbation techniques. The linear model may then be analyzed using analysis tools. For example, the linear model may be analyzed to assess the stability of the model around the operating point at which the model is linearized. The linear model may be analyzed to provide the time or frequency response of the model about the operating point.

In the description of embodiments, a model may refer to a mathematical representation of a dynamic system that may be executable on a computing device.

Figure 1:
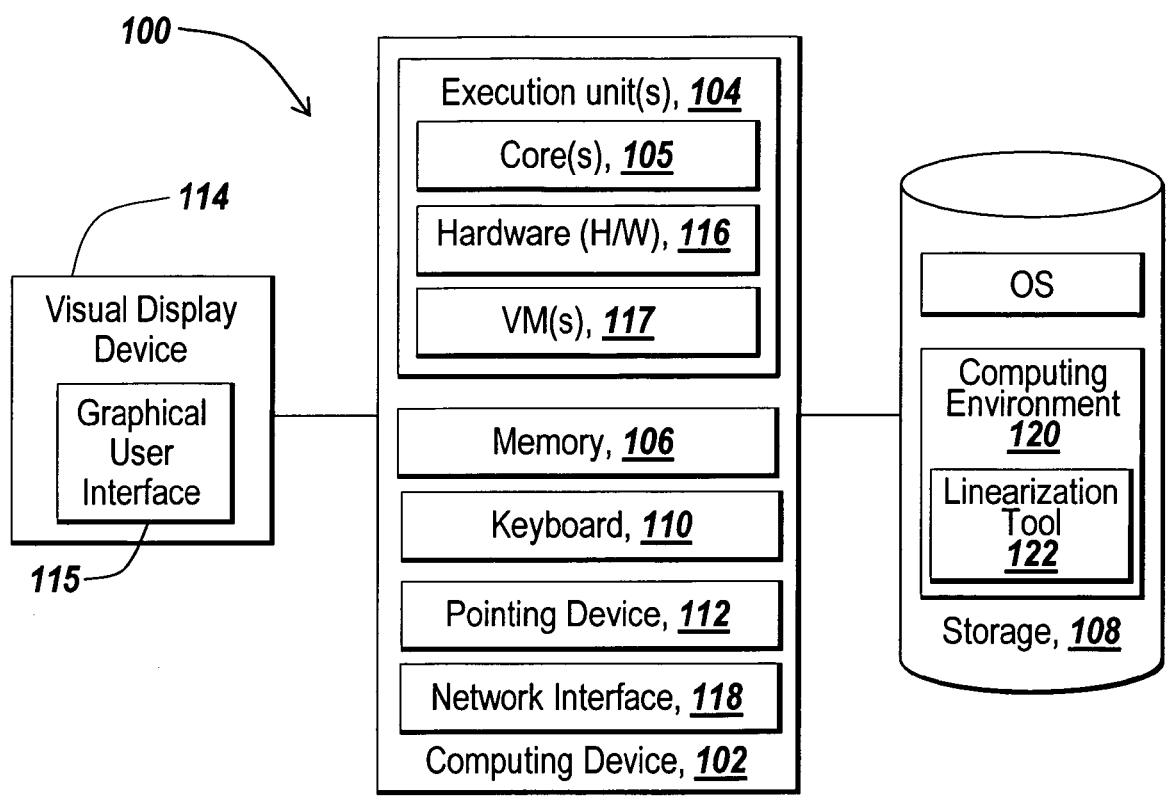
FIG. 1 is an exemplary computing device for implementing an exemplary embodiment.

FIG. 1 depicts an exemplary computing device 100 suitable for practicing an embodiment. Computing device 102 may include execution units 104, memory 106, keyboard 110, pointing device 112 and network interface 118. Execution units 104 may include hardware or software based logic to execute instructions on behalf of computing device 102. For example, in one implementation, execution units 104 may include one or more processors, such as a microprocessor. In one implementation, the execution unit 104 may include single or multiple cores 105 for executing software stored in the memory 106, or other programs for controlling the computing device 102. In another implementation, execution units 104 may include hardware, such as a digital signal processor (DSP), a graphics processing unit (GPU), a field programmable gate array (FPGA), an application specific integrated circuit (ASIC), etc., on which at least a part of applications can be executed. In another implementation, execution units 104 may include virtual machine (VM) 117 for executing the code loaded in the memory 106. Multiple VMs 117 may be resident on a single execution unit 104.

The memory 106 may include a computer system memory or random access memory (RAM), such as dynamic RAM (DRAM), static RAM (SRAM), extended data out RAM (EDO RAM), Magnetoresistive Random Access Memory (MRAM), etc. The memory 106 may include other types of memory as well, or combinations thereof. A user may interact with the computing device 102 through a visual display device 114, such as a computer monitor, which may include a graphical user interface (GUI) 115. The computing device 102 may include other I/O devices, such a keyboard 110 and a pointing device 112 (for example, a mouse) for receiving input from a user. Optionally, the keyboard 110 and the pointing device 112 may be connected to the visual display device 114. The computing device 102 may include other suitable conventional I/O peripherals. Moreover, the computing device 102 may be any computer system such as a workstation, desktop computer, server, laptop, handheld computer or other form of computing or telecommunications device that is capable of communication and that has sufficient processor power and memory capacity to perform the operations described herein.

Additionally, the computing device 102 may include a network interface 118 to interface to a Local Area Network (LAN), Wide Area Network (WAN) or the Internet through a variety of connections including, but not limited to, standard telephone lines, LAN or WAN links (e.g., T1, T3, 56 kb, X.25), broadband connections (e.g., integrated services digital network (ISDN), Frame Relay, asynchronous transfer mode (ATM), wireless connections (e.g., 802.11), high-speed interconnects (e.g., InfiniBand, gigabit Ethernet, Myrinet) or some combination of any or all of the above. The network interface 118 may include a built-in network adapter, network interface card, personal computer memory card international association (PCMCIA) network card, card bus network adapter, wireless network adapter, universal serial bus (USB) network adapter, modem or any other device suitable for interfacing the computing device 102 to any type of network capable of communication and performing the operations described herein.

The computing device 102 may further include a storage device 108, such as a hard-drive or CD-ROM, for storing an operating system (OS) and for storing application software programs, such as the computing application or environment 120. The computing environment 120 may run on any operating system such as any of the versions of the Microsoft® Windows operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein. Furthermore, the operating system and the computing environment 120 can be run from a bootable CD, such as, for example, KNOPPIX®, a bootable CD for GNU/Linux.

The computing environment 120 may enable a user or programmer to build and execute a program or model. The computing environment 120 may include a text-based programming or modeling environment. An exemplary computing environment may be available in the MATLAB® environment, from The MathWorks, Inc., LabVIEW® or MATRIXx from National Instruments, Inc., Mathematica® from Wolfram Research, Inc., Mathcad of Mathsoft Engineering & Education Inc., Maple™ from Maplesoft, a division of Waterloo Maple Inc., Comsol from Comsol AB of Sweden, Scilab™ from The French National Institution for Research in Computer Science and Control (INRIA), Le Chesnay Cedex, France, GNU Octave, C++, JAVA, etc.

The computing environment 120 may include a graphical programming or modeling environment. An exemplary computing environment may be available in the Simulink® environment, the SimEvents® environment, the Stateflow® environment, the Simscape environment, the SimMechanics environment, the SimPowerSystems environment, the SimHydraulics® environment, the SimDriveline environment, all from The MathWorks, Inc., LabVIEW® or MATRIXx from National Instruments, Inc., SoftWIRE by Measurement Computing, VisSim by Visual Solutions, WiT by DALSA Coreco, VEE Pro by Agilent, Dymola from Dynasim AB, Extend from Imagine That, Inc., Scicos from The French National Institution for Research in Computer Science and Control (INRIA), MSC.Adams® from MSC.Software Corporation, Rhapsody® from iLogix, Inc., Rational® from International Business Machines Corporation, ARTiSAN Studio from ARTiSAN Software Tools, Inc., SCADE™ from Esterel Technologies, Inc., Unified Modeling Language (UML) and its derivatives, such as System Modeling Language (SysML), etc.

The computing environment 120 may include a linearization tool 122 that enables a user to linearize and analyze a model to determine the characteristics of the model. The linearization tool 122 will be described below in more detail with reference to FIGS. 2-6.

Figure 2:
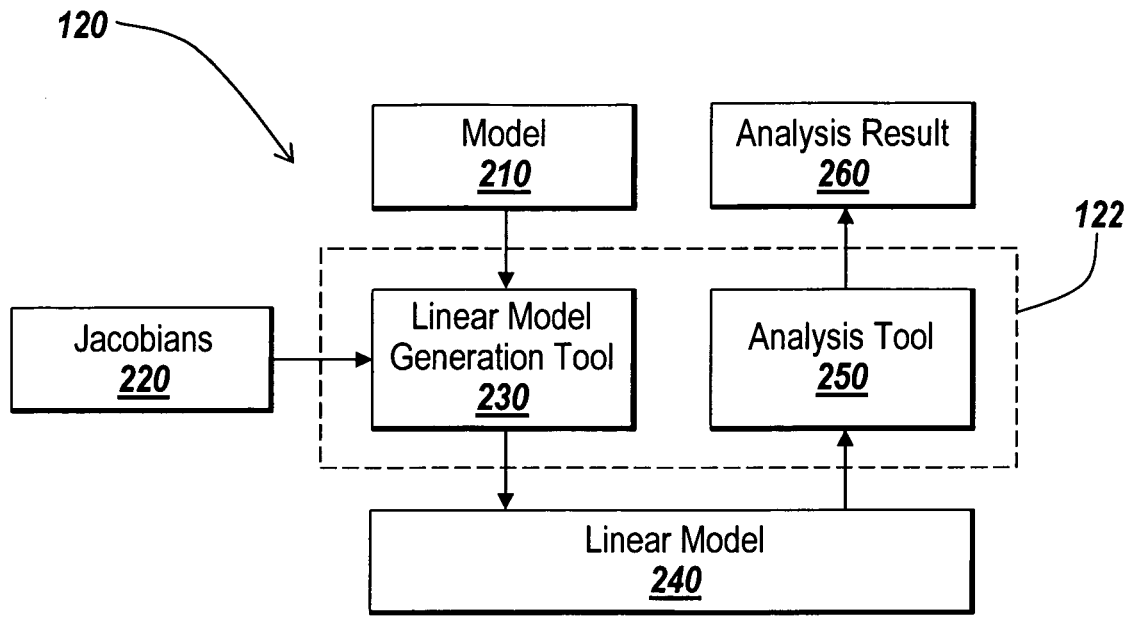
FIG. 2 is an exemplary computing environment provided by an exemplary computing device.

FIG. 2 is an exemplary computing environment 120 for linearizing a model. The linearization tool 122 may include a linear model generation tool 230 and an analysis tool 250. The linear model generation tool 230 may receive a model 210 representing a system. The model 210 may include zero or more differential equations and zero or more algebraic equations to represent the system. The linear model generation tool 230 may also receive the Jacobians 220 of the model or part of the model. The Jacobians 220 may be provided by the computing environment 120 or another tool that is coupled to the computing environment 120. The linear model generation tool 230 may generate a linear model 240 of the system using the Jacobians. The linear model generation tool 230 may generate the linear model in a state-space representation which the engineering analysis tool 250 can be applied to.

The analysis tool 250 may analyze the linear model 240 and determine the characteristics of the model 210 around the operating point where the model 210 is linearized. The analysis tool 250 may provide analysis results 260 to a user so that the user can determine the characteristics of the system around the operating point. The analysis results 260 may provide information on the stability of the system around the operating point. The analysis results 260 may provide various types of responses, such as a frequency response, a step response, etc.

Figure 3:
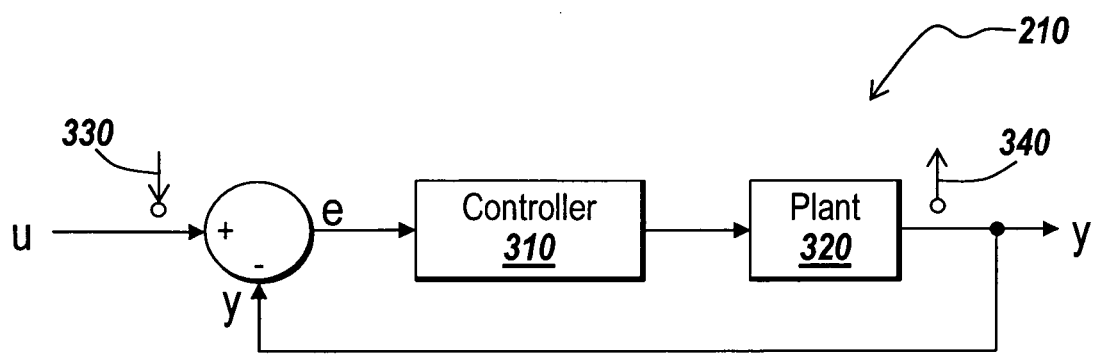
FIG. 3 is an example block diagram model linearized in an exemplary embodiment.

FIG. 3 is an exemplary block diagram model of a control system. The exemplary block diagram model is provided to show how a model is linearized using the Jacobian of the model in an exemplary embodiment. The model 210 may include a controller 310 and a plant 320 to generate an output (y) in response to an input (u). A feedback signal is used to compute an error signal (e) that is the difference between the input (u) and the output (y). The error signal (e) is then an input to the controller 310. The controller 310 is designed to respond to the error signal (e) and compute a command to change the output of the plant 320.

The input (u) and the output (y) may be specified by a user. For example, the linearization input and output points can be specified on signals 330 and 340 in the model 210. The signal 330 may specify a linearization input and the signal 340 may specify a linearization output. Therefore, the linearization of the model will contain the effects of changes in the reference input (u) on the output (y).

In the process of linearization, the computing environment 120 may determine the system of equations from the network of entities in the block diagram model 210. In order to do this, the computing environment 120 may determine block connectivity in the model 210. So-called virtual blocks in the model 210 only have a graphical bearing with the purpose to help organize a model in hierarchical levels. These virtual blocks may be removed and the remaining non-virtual blocks are reconnected to each other appropriately. Then, the model 210 is transformed into a compiled (in-memory) directed graph consisting of arcs and vertices. The arcs represent data dependencies between the vertices. The data dependencies do not correspond to the signals in the model 210. For example, all signals that connect to input ports without direct feed through are "cut" or ignored. In addition, data dependencies are added to capture implicit dependencies. For example, all inputs to a Function-Call subsystem are implicit data dependencies to the owner (caller) block.

The directed graph is used to sort the blocks into a linear sorted list. During the sorting of the graph into the list, strongly connected components are identified. The term strongly connected component, which is a term that originates from graph theory, refers to a subset, S, of the blocks of a block diagram such that any block in S is reachable from any other block in S by following signal connections and S is not a subset of any larger such set. Strongly connected components are flagged as algebraic loops when all blocks have direct feedthrough. Such loops correspond to a set of algebraic equations and may be solved using iterations and perturbations during block diagram execution by solving for the algebraic variables. Algebraic variables are either specified by the user via initial condition blocks or chosen by the execution engine.

Block method execution lists are derived from the sorted list for execution of the block diagram. A block method execution list is a list of block methods that are to be executed in a sequence when each method within the list has a sample hit. There is a set of block method execution lists associated with each layer of the block diagram that corresponds to a non-virtual subsystem. Non-virtual subsystems are either defined by the user or automatically synthesized during compilation to either efficiently execute the model or to simplify the implementation of the semantics defined by the computing environment 120. The block method execution lists may be utilized to determine the system of equations in the block diagram model 210 and to execute the model 210 over a desired time-span.

In physics based modeling formalisms such as multi-body modeling and electrical circuit modeling, a block diagram model may consist of entities that are related by bidirectional connections. These bidirectional connections may represent variables that have opposing input/output characteristics. For example, an electrical resistor may be represented by a block that has two connections; one on the positive and one on the negative port of the resistor. These connections typically represent two variables; a current and a voltage. Whether the voltage is the input to the resistor block and the current the output or the other way around depends on how the resistor is used. If it is current driven, the current is input and the voltage is output. If it is voltage driven, the voltage is input and the current is output. This input/output character is referred to as the computational causality.

In physics based modeling environments, the computational causality is not required to be defined by the user. The user can simply connect the entities without regards for the input/output dependencies of elementary variables on each of the connections. When the model is constructed, an automated analysis can be performed to determine the input/output character of each of the variables for each of the blocks and the equations that define the functionality of each of the blocks.

Often, this requires a semi-local analysis, as the computational of one block may have a bearing on the computational causality of another block. Therefore, a set of blocks that are connected may be replaced by one system of equations that accounts for the computational causality and that may be further optimized by substitution and elimination of equations. This set of blocks can be considered one (or multiple, but reduced) blocks in a context of blocks with computational causality pre-assigned. As such, the set of blocks can be linearized as an individual subsystem embedded in a larger model.

The computing environment 120 or another tool that is coupled to the computing environment 120 may determine Jacobians from the network of entities in the block diagram model 210. In an embodiment, the computing environment 120 may include a tool that has a facility for automatically generating Jacobians for network equations. The computing environment 120 may provide an Application Program Interface (API) for obtaining Jacobians from the network of entities in the block diagram model 210. The API may be provided using, for example, S-function methods in the SIMULINK environment.

An illustrative embodiment may provide an interface for initializing the operating point of the model 210. To linearize the model 210, a user may specify an operating point. A user may linearize the model 210 using one of the operating points stored in the workspace. The computing environment 120 may provide a user interface that shows the operating points stored in the workspace so that the user can select one of the operating points. The operating point is initialized with the value stored in the workspace.

An illustrative embodiment may perform the linearization of the model 210 while in the process of simulation of the model 210. A user may specify, through a user interface, the specific simulation time and events when the linearization should occur. During a simulation, at the user specified events, the block diagram model 210 may be linearized to determine a linear model and return the results to the user for later analysis. In specifying the time and events of when the linearization analysis should occur, the user can set the linearization to occur based on time or condition events, such as a changing variable, a rising, falling, or rising and falling variable, or combinations of any of these parameters in addition to the use of function calls. The user can define a number of different instances where the automated linearization will occur during the simulation of the model 210.

The computing environment 120 may store the linearization results in the model 210, for example, as an object in the model workspace. Alternatively, the computing environment 120 may store the linearization results in the global workspace separately from the model. The global workspace refers to a virtual data container for storing information/data in the computing environment 120. The data objects contained in the global and model workspace may include data defining the types and values of variables and the data defining the signals and/or states in the block diagram model. The contents of the workspace can be accessed and/or modified via the workspace's programmatic and graphical user interfaces.

The computing environment 120 may analyze the linear model 240 to verify the design of the model 210. The computing environment 120 may perform formal analyses of the model 210 using the relinearized model around the linearization point. For example, the computing environment 120 may generate test cases that achieve model coverage and custom objectives that a user specifies in the model 210. The computing environment 120 may prove properties that a user specifies in the model 210, and identify examples of any property violations. The computing environment 120 may produce detailed reports regarding test case generation and property proofs. The proofs may require linear representations and so in case of nonlinearities in the model, these can be linearized and proofs of properties formulated and proved around the operating point at which the linearization was performed.

The linearization may by performed on the entire model or parts of it, for example, on the content of a nonvirtual subsystem.

In an embodiment, a set of blocks in the model may be replaced with the linearized system of equations. The linearized system of equations may be used for the analysis or execution of the model 210. The details of the linearization process will be described below.

The model 210 may represent a control system with sets of nonlinear differential equations and/or algebraic equations. When the model 210 includes at least one algebraic equation, the mass matrix of the model 210 may be singular. The model 210 with a singular mass matrix can be represented by the following differential algebraic system of equations (DAE):

$$\begin{pmatrix} M_d(t, x_d, x_a, u) & 0 \\ 0 & 0 \end{pmatrix} \begin{pmatrix} \dot{x}_d \\ \dot{x}_a \end{pmatrix} = \begin{pmatrix} F_d(t, x_d, x_a, u) \\ F_a(t, x_d, x_a, u) \end{pmatrix} \quad \text{(Equation 1)}$$

$$y = G(t, x_d, x_a, u) \quad \text{(Equation 2)}$$

Where:
t—time;
$x_d$—a vector of differential state variables of length m;
$x_a$—a vector of algebraic state variables of length n;

$\dot{x}_d$—a vector of differential state variable derivatives of length m;
$\dot{x}_a$—a vector of the algebraic state variable derivatives of length n;
u—a vector of input variables of length p;
y—a vector of output variables of length q;
$F_d(t,x_d,x_a,u)$—a nonlinear differential forcing function;
$F_a(t,x_d,x_a,u)$—a nonlinear algebraic forcing function;
$G(t,x_d,x_a,u)$—a nonlinear output function; and
$M_d(t,x_d,x_a,u)$—a differential mass matrix.

In the computing environment 120, the forcing function $F=[F_d; F_a]$, the output function G and the differential mass matrix $M_d$ may be determined by the model 210. That is, F, G and $M_d$ may be determined by the choice of the blocks, block interconnectivity, and the operating point of the model 210. The differential mass matrix $M_d$ is assumed to be square and nonsingular for all values of t, $x_d$, $x_a$, and u while the mass matrix of the model 210, which is defined as $M:=[M_d\,0;\,0\,0]$, is singular. A matrix is square if the number of rows is equal to the number of columns. A matrix is singular if its determinant is zero. A matrix is nonsingular if its determinant is not zero.

From the model 210 represented in Equations 1 and 2, the linear model generation tool 230 may generate the linear model 240 in the following state-space representation without using perturbation techniques.

$$\dot{x}=Ax+Bu$$

$$y=Cx+Du,$$

where x is a state variable vector and A, B, C and D are matrices.

To obtain the above linear state-space representation, the linear model generation tool 230 may use the following analytic Jacobians.

$$\frac{\partial F}{\partial x} = \begin{pmatrix} \frac{\partial F_d}{\partial x_d} & \frac{\partial F_d}{\partial x_a} \\ \frac{\partial F_a}{\partial x_d} & \frac{\partial F_a}{\partial x_a} \end{pmatrix}$$

where $F=[F_d; F_a]$ and $x=[x_d, x_a]$. The analytic Jacobians may be provided by the computing environment 120 or another tool coupled to the computing environment 120. For the detailed description of an embodiment, the model 210 is assumed to be a DAE of index 1 of the form given by Equation 1. Any index-1 DAE of the form represented by Equation 1 satisfies the following: the Jacobian $J_{aa}$, which is defined as the partial derivative of algebraic forcing function $F_a$ with respect to algebraic state variables $x_a$, is always nonsingular. Since the Jacobian $J_{aa}$ is nonsingular, the algebraic state variables $x_a$ may be considered as a function of the differential state variables $x_d$ and the input u locally so that algebraic variables $x_a$ can be denoted as $x_a(x_d, u)$. This may be guaranteed by the implicit function theorem applied to $F_a(t, x_d, x_a, u)=0$.

Equations 3 and 4 may be defined as follows.

$$m(t,x_d,u):=M_d(t,x_d,x_a(x_d,u),u) \quad \text{(Equation 3)}$$

$$f(t,x_d,u):=F_d(t,x_d,x_a(x_d,u),u) \quad \text{(Equation 4)}$$

In Equation 3, $m(t, x_d, u)$ is nonsingular because $M_d$ is nonsingular. For the output y, Equation 5 may be defined as follow.

$$g(t,x_d,u):=G(t,x_d,x_a(x_d),u) \quad \text{(Equation 5)}$$

The linear model generation tool 230 may apply the definitions of Equations 3 and 4 to the differential equation of Equation 1 to produce Equation 6.

$$m(t,x_d,u)\dot{x}_d=f(t,x_d,u) \quad \text{(Equation 6)}$$

Both sides of Equation 6 may be multiplied by $m^{-1}(t, x_d, u)$ as follows.

$$\dot{x}_d=m^{-1}(t,x_d,u)f(t,x_d,u) \quad \text{(Equation 7)}$$

Since Equations 6 and 7 represent an equivalent system of Equation 1, the A matrix of the linear state-space representation may be defined as follows.

$$A := \frac{\partial \dot{x}_d}{\partial x_d}$$

To obtain the A matrix, Equation 6 may be differentiated with respect to $x_d$ as follows.

$$m\frac{\partial \dot{x}_d}{\partial x_d} + \left(\frac{\partial m}{\partial x_d(1)}\dot{x}_d, \ldots, \frac{\partial m}{\partial x_d(n)}\dot{x}_d\right) = \frac{\partial f}{\partial x_d} \quad \text{(Equation 8)}$$

Equation 8 can be solved for, $$\frac{\partial \dot{x}_d}{\partial x_d} \text{ if } \dot{x}_d, \; \frac{\partial f}{\partial x_d}, \; \frac{\partial M_d}{\partial x_d(i)} \text{ for each } i=1\ldots n_d,$$

wherein $n_d$=length $(x_d)$, are known. First, $\dot{x}_d$ can be obtained from the equation given by the top row of Equation 1, $$M_d\dot{x}_d = F_d. \text{ Next, } \frac{\partial f}{\partial x_d}$$

can be obtained from differentiating Equation 4 with respect to $x_d$ as follows.

$$\frac{\partial f}{\partial x_d} = \frac{\partial F_d}{\partial x_d} + \frac{\partial F_d}{\partial x_a}\frac{\partial x_a}{\partial x_d}$$

In this equation, all the quantities on the right-hand side are pieces of the analytic Jacobians, except for $$\frac{\partial x_a}{\partial x_d}. \; \frac{\partial x_a}{\partial x_d}$$

can be obtained by differentiating the algebraic equation of Equation 1 with respect to $x_d$, which may result in Equation 9.

$$\frac{\partial x_a}{\partial x_d} + \frac{\partial F_a}{\partial x_a}\frac{\partial x_a}{\partial x_d} = 0 \quad \text{(Equation 9)}$$

$$\frac{\partial x_a}{\partial x_d}$$

can be solved from Equation 9 because $J_{aa}$ is nonsingular. In an embodiment, if $J_{aa}$ is singular or nearly singular, a warning that the results may be inaccurate may be issued to a user.

$$\frac{\partial m}{\partial x_d(i)} \text{ for each } i = 1 \ldots n_d,$$

wherein $n_d$=length $(x_d)$, can be obtained in a similar fashion by differentiating equation 3 with respect to $x_d$.

The B matrix can also be obtained in a similar way by differentiating Equation 4 with respect to u. This requires the analytic Jacobians $$\frac{\partial F}{\partial u}$$

as well as $$\frac{\partial M_d}{\partial u}.$$

The matrices C and D are obtained by differentiating Equation 5 with respect to $x_d$ and u, respectively. This requires the analytic Jacobians $$\frac{\partial G}{\partial x}$$

and $$\frac{\partial G}{\partial u}.$$

In the above description, the model is assumed to be an index 1 system. Index-2 or higher systems, such as circuits with capacitor loops and/or inductor cutsets, can be handled by reducing the system to index 1 and then applying the process described above.

For example, a subclass of index-2 systems may be reduced to index 1 systems by the following reduction mechanism. This is an illustrative index reduction, the general approach may apply any index reduction mechanism to obtain an index 1 system. Index-2 systems of the form given by equation 1 may be characterized by constraints among the differential states, of the form $H(x_d)=0$. These constraints may result from linear combinations of algebraic equations of equation 1. For simplicity, the reduction mechanism may restrict to determine the linear combinations of linear algebraic equations (linear in the states, with constant coefficients and zero right-hand side) such that the states involved in the linear combination are all differential states.

This may be done by forming the portion of the Jacobian matrix given by partial derivatives of linear algebraic equations with respect to all state variables, ordered as $(x_d\ x_a)$. To this matrix, the reduction mechanism may append additional rows, consisting of the identity matrix of size (number of differential variables), zero-padded on the right so that the number of columns is the total number of states. The resulting matrix may be called matrix A. Then, the reduction mechanism may determine a maximal set of linearly independent rows in matrix A, starting from the first row and choosing each subsequent row when it is independent of all previously seen independent rows. Details of this process are described in co-pending U.S. patent application Ser. No. 11/375,915 entitled "System and Method of Generating Equation Level Diagnostic Error Messages for Use in Circuit Simulation," the content of which is incorporated herein by reference in its entirety.

The co-pending application also describes coefficients showing how to form a 0 row as a linear combination of a dependent row and zero or more independent rows, with nonzero coefficient on the dependent row. The dependent rows may be a subset of the additional identity rows, since a dependency among the original algebraic equations is illegal. Taking the coefficients in the combination of rows of the combination corresponding to linear algebraic equations of the original system, multiplying each coefficient by its corresponding linear algebraic equation and adding the equations together, results in a linear constraint among the differential states only, which we denote by $Cx_d=0$.

To get an equivalent index-1 system to Equation 1, the reduction mechanism may rewrite the differential equations of Equation 1 in the form of Equation 7. The differential equations correspond to the identity rows in the matrix analyzed above for independent and dependent rows. For each dependent row (which is an identity row), the corresponding differential equation, equation k, is replaced with the equation $C*(M_d^{-1}f_d)=0$, obtained by differentiating $Cx_d=0$ with respect to time and substituting for the time derivative of $x_d$ using Equation 7. This results in an index-1 system.

Figure 7A:
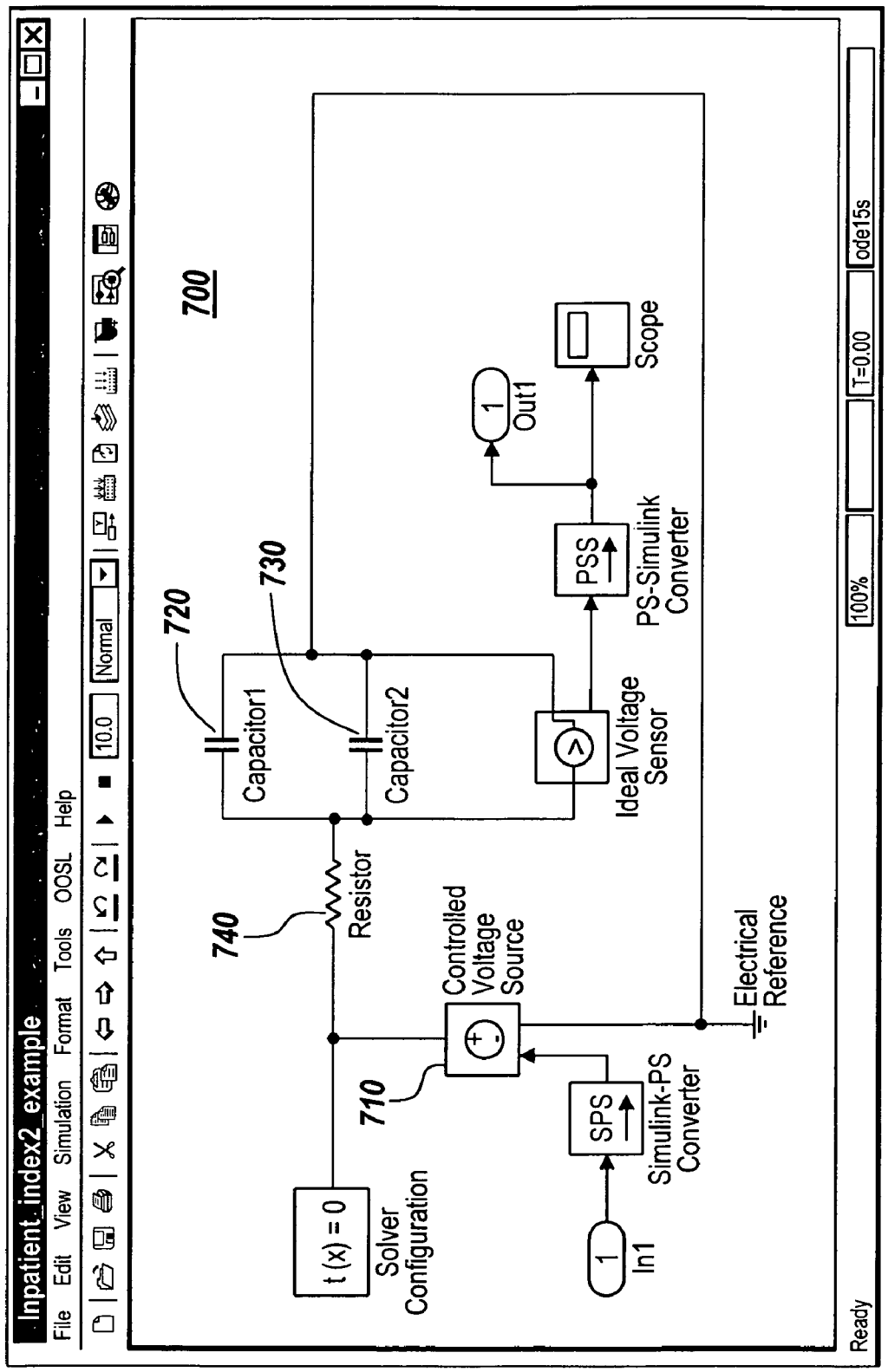
FIG. 7A depicts an exemplary circuit to be linearized in an exemplary embodiment.

An example is provided to illustrate the index reduction mechanism. FIG. 7A depicts an exemplary circuit 700 to be linearized in the exemplary embodiment. If the voltage of the voltage source 710 is Vs (considered an external input, not a system variable) and the voltages across the linear capacitors 720 and 730, with capacitances C1 and C2 respectively are called v1 and v2 respectively, and the currents through them are called i1 and i2 respectively, and the conductance of the resistor 740 is some nonzero G, system equations can be written as follows:

$C1*dv1/dt=i1$ $C2*dv2/dt=i2$ $0=G*v1+i1+i2-G*Vs$ $0=v1-v2$

The circuit 700 is an index-2 system because the fourth equation gives a constraint among the differential states v1 and v2.

The Jacobian of the linear algebraic equations (the last two) with respect to the state vector (v1 v2 i1 i2) is (G 0 1 1; 1 −1 0 0). With the identity rows appended as described above, the matrix A is (G 0 1 1; 1 −1 0 0; 1 0 0 0; 0 1 0 0). The analysis described in co-pending U.S. patent application Ser. No. 11/375,915 shows that the first three rows A(1:3,:) are independent, and the last row A(4,:) is dependent, with A(4,:)=−A(2,:)+A(3,:) The rows of the dependency corresponding to original linear algebraic equations are (in this case, just one row) −A(2,:), with coefficient −1, so the state constraint equation is −1*(v1−v2)=−1*0, or v2−v1=0.

The dependent row in the dependency is the second identity row, so the second differential equation is replaced with the differentiated state constraint equation dv2/dt−dv1/dt=0, substituting for dv1/dt and dv2/dt using the differential equations to get i2/C2−i1/C1=0.

Figure 7B:
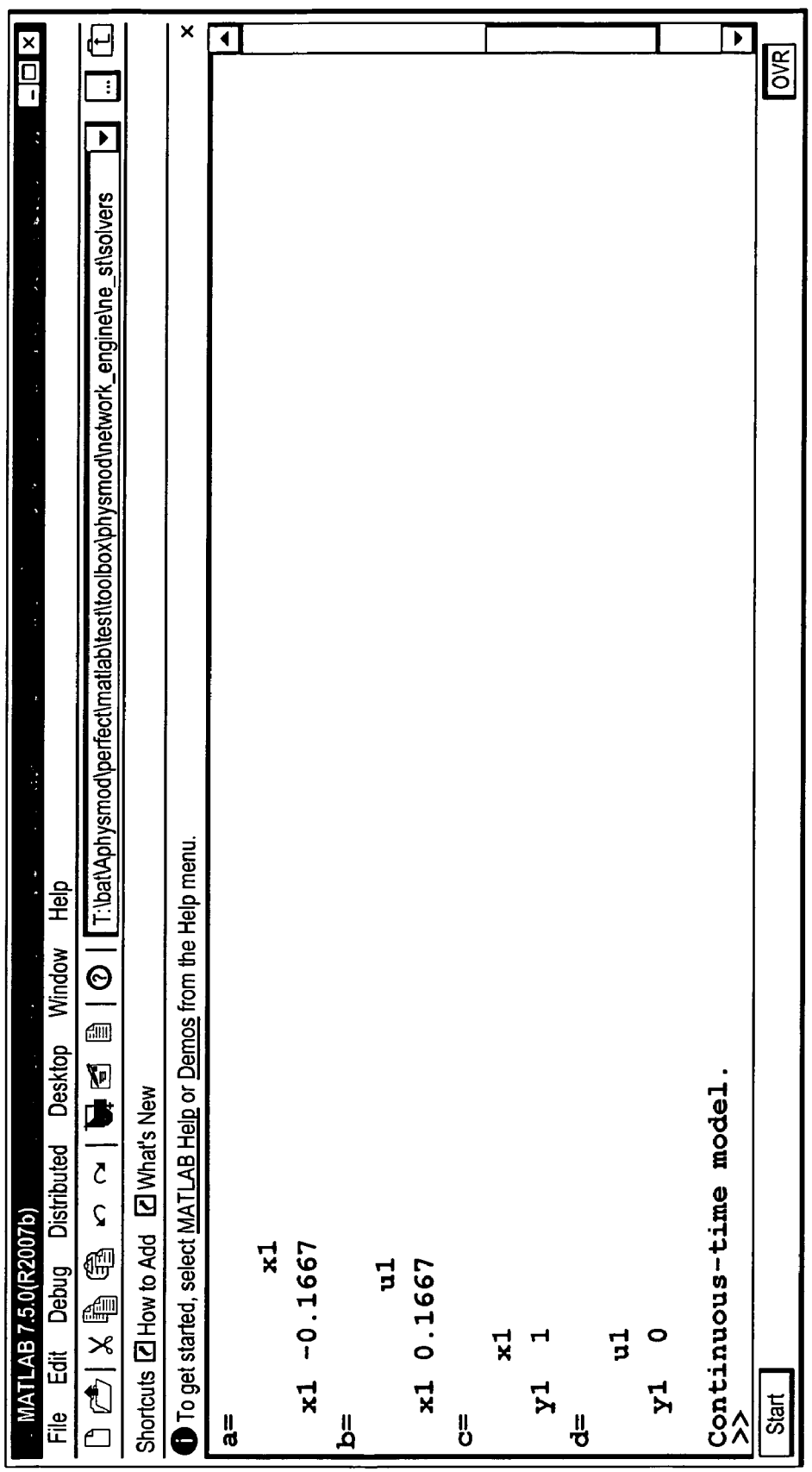
FIG. 7B shows the resulting [A,B,C,D] linear model of the circuit depicted in FIG. 7A.

Thus the new system is $C1*dv1/dt=i1$ $0=-i1/C1+i2/C2$ $0=G*v1+i1+i2-G*Vs$ $0=v1-v2$ The new system is index-1, and the linearization method described above with reference to index 1 system may be applied to linearize the new system. FIG. 7B shows the resulting [A,B,C,D] linear model of the circuit depicted in FIG. 7A, which is obtained by applying the linearization algorithm to the reduced index 1 system. In this example, the capacitances C1 and C2 in the system of equations are both 3 farads and the conductance G of the resistor is 1 1/Ohm. In the [a,b,c,d] linear model, x1 represents the single independent dynamic state of the system (the voltage across capacitor1). u1 represents the input (input port 1) and y1 represents the output (output port 1). The linearized model is $dx1/dt=-0.1667*x1+0.1667*u1$, $y1=x1$.

In many programming or modeling tools, physical models can be described by continuous differential equations, discrete equations of motion, or hybrids of continuous and discrete equations. The above described linear space representation can be implemented with the models in the continuous differential equations, discrete equations of motion, or hybrids of continuous and discrete equations.

The following pseudo-code is provided to show an exemplary algorithm for the linearization process described above. In the code, x(:) may denote the column vector obtained by taking entries of x in column-major order (column by column from left to right).

Input:

$$\frac{\partial F}{\partial x} = \begin{pmatrix} \frac{\partial F_d}{\partial x_d} & \frac{\partial F_d}{\partial x_a} \\ \frac{\partial F_a}{\partial x_d} & \frac{\partial F_a}{\partial x_a} \end{pmatrix}, \quad M_d, F_d, \frac{\partial M(:)}{\partial x} = \left( \frac{\partial M(:)}{\partial x_d}, \frac{\partial M(:)}{\partial x_a} \right)$$

Output:

$$A = \frac{\partial \dot{x}_d}{\partial x_d}$$

Compute $$\frac{\partial x_a}{\partial x_d} = -\frac{\partial F_a}{\partial x_a} \backslash \frac{\partial F_a}{\partial x_d}$$

if $M_d$ is state dependent,
Compute $$\dot{x}_d = M_d \backslash F_d.$$

Compute $$\frac{\partial m(:)}{\partial x_d} = \frac{\partial M_d(:)}{\partial x_d} + \frac{\partial M_d(:)}{\partial x_a} \frac{\partial x_a}{\partial x_d}$$

$n_d$=number of columns of $M_d$
for i=1: $n_d$
   Compute $$\frac{\partial m}{\partial x_d(i)} = \begin{pmatrix} \frac{\partial m(:)}{\partial x_d}(1, i) & \cdots & \frac{\partial m(:)}{\partial x_d}(n_d(n_d-1)+1, i) \\ \vdots & & \vdots \\ \frac{\partial m(:)}{\partial x_d}(n_d, i) & \cdots & \frac{\partial m(:)}{\partial x_d}(n_d^2, i) \end{pmatrix}$$

End
End
Compute $$r = \frac{\partial f_d}{\partial x_d} = \frac{\partial F_d}{\partial x_d} + \frac{\partial F_d}{\partial x_a} \frac{\partial x_a}{\partial x_d}$$

if $M_d$ is state dependent, $$r := r - \left( \frac{\partial m}{\partial x_d(1)} \dot{x}_d \cdots \frac{\partial m}{\partial x_d(n_d)} \dot{x}_d \right)$$

End
Compute $$A = \frac{\partial \dot{x}_d}{\partial x_d} = M_d \backslash r$$

Figure 4:
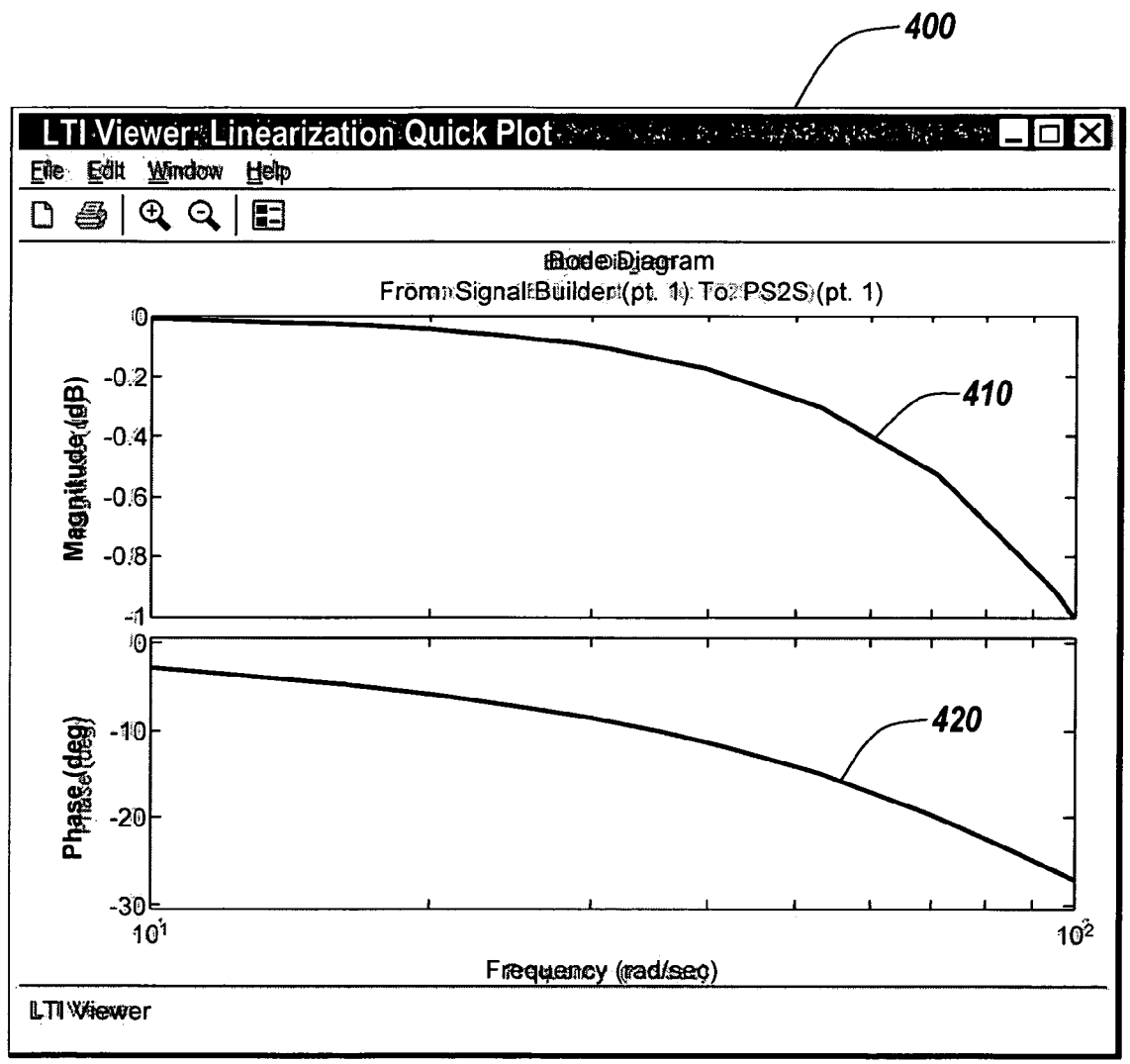
FIG. 4 is an exemplary analysis result generated in an exemplary embodiment.

FIG. 4 shows a user interface that may display an exemplary analysis result of the linear model 240. In an embodiment, the analysis tool 250 may analyze the linear model 240 and display a Bode Diagram in the user interface 400. The Bode Diagram may include magnitude plot 410 versus frequency and phase plot 420 versus frequency.

Figure 5:
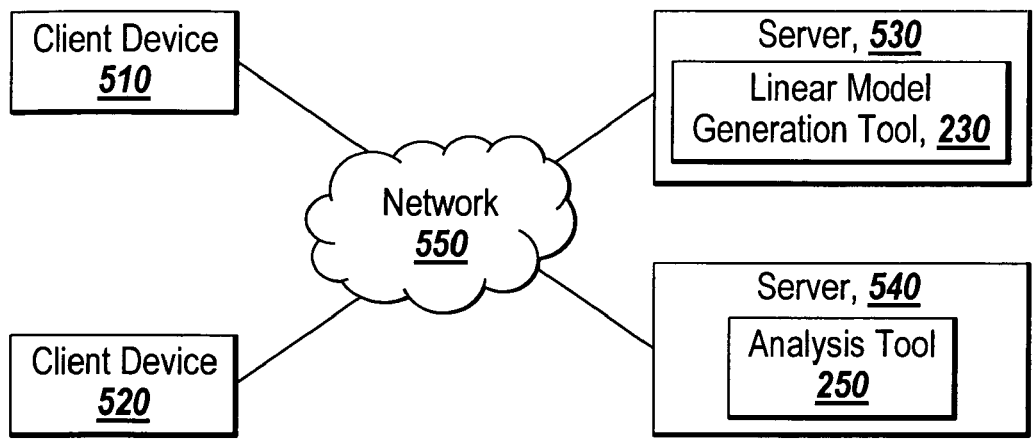
FIG. 5 an exemplary network environment suitable for practicing an exemplary embodiment.

FIG. 5 depicts an exemplary network environment 500 suitable for practicing an exemplary embodiment. The environment 500 may include client devices 510 and 520 in communications with servers 530 and 540 over the network 550. The computing environment 120 may have one or more software components that run on each of the clients 510 and 520 and servers 530 and 540.

The client devices 510 and 520 may provide an interface functionality that enables a user to access the computing application or environment 120. With the interface functionality, the user may input the specification of models to be linearized in the computing environment 120. The user may specify a model with linearization points. The user may also specify the type of the analysis results that the user wants to receive from the analysis tool 250. The client devices 510 and 520 may communicate with the servers 530 and 540 to request linearization and to receive analysis results.

The servers 530 and 540 may be coupled to the network 550. The servers 530 and 540 may include the linear model generation tool 230 and the analysis tool, respectively. The server 530 may generate a linear model in a state-space representation and forward the linear model to the server 540. The server 540 may receive and analyze the linear model to produce the analysis results. The server 540 may send the results to client devices 510 and 520 so that client devices 510 and 520 can display the result to the user.

Figure 6:
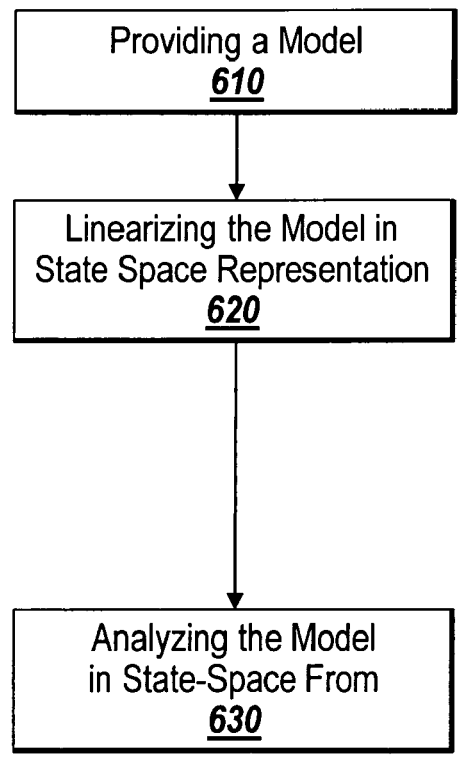
FIG. 6 is an exemplary flow chart illustrating an exemplary process of a computing environment for generating and analyzing a linear model.

FIG. 6 is a flow chart illustrating an exemplary process of a computing environment for generating and analyzing a linear model. The computing environment may receive a model with input data that may specify the linearization points in the model (step 610). The computing environment may provide the Jacobians of the model to be linearized. The computing environment may linearize the model in a state-space representation using the Jacobians of the model (step 620). The computing environment may analyze the linear model to determine the characteristics of the model around the operating point where the model is linearized (step 630).

In an exemplary embodiment, the linearization of models may be used to represent physical connections of components in many physical domains, including hydraulic, mechanical, pneumatic, and electrical domains. The linearization may take the effect of state-dependence of the mass matrix into account analytically. The linear model may be represented in the state-space in which the state variables are differentiated. Because the state variables of the linear model are the dynamic states of the original system, users can get, for example, step and impulse responses of the dynamic states with respect to specific inputs.

An embodiment may be implemented with a tool that has a facility for automatically generating Jacobians for the network equations. A model developer may write constitutive law equations for the various components, such as accumulators, pumps, valves, etc. for a model, and the tool's facility may generate Jacobians automatically.

The analytic linearization may provide advantages over the linearization using perturbation techniques. The perturbation techniques may be unreliable because of the lack of a good way to choose the perturbation size, and also be less efficient than analytic linearization. For example, assuming a model of a simple RC-series circuit including a voltage source, linear resistor, and a linear capacitor in a loop, the input may be the source voltage and the output may be the capacitor voltage. From basic circuit analysis, this system has one pole at s=−1/(RC). Since this pole is in the left half-plane, the circuit is stable. If the circuit is modified to a circuit in which the linear resistance R is replaced by a circuit whose characteristic is $$i = f(v) = \begin{cases} Gv + 2\epsilon G, & \text{if } v < -\epsilon \\ -Gv, & \text{if } -\epsilon \le v \le \epsilon \\ Gv - 2\epsilon G, & \text{if } v > \epsilon \end{cases}$$

where $\epsilon$ is some value much smaller than the perturbation value chosen for linearization. There is still a steady-state operating point for which capacitor voltage equals the input voltage. However, it is no longer a stable operating point because the true linearization at this operating point gives a linearized resistance of −R, so that the pole moves to s=1/(RC) in the right half-plane. If the linearization is computed using perturbation p with $\epsilon \ll p$, the linearized conductance at v=0 is computed as [f(p)−f(0)]/[p−0] which is ≈G, giving a resistance R, so the pole appears to be near s=−1/(RC) again, and the system appears to be stable. Thus an inaccurate linearization results from using perturbation to compute it, and this inaccurate linearization can lead to seriously erroneous conclusions. The analytic linearization, however, can provide accurate linearization results.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure and method may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. A computer-implemented method of linearizing a model of a system, said method comprising:
   obtaining the model of a system, the model including at least one differential-algebraic equation to represent the system, a mass matrix of the model being singular;
   obtaining at least one analytic Jacobian of at least a part of the model;
   linearizing, using a processor of a computer, the at least a part of the model using the at least one analytic Jacobian, a state-space representation of the linearized part of the model including one or more matrices;
   using the linearized part of the model to solve at least part of the singular part of the mass matrix;
   using the result of solving at least part of the singular part of the mass matrix to determine a new non-singular mass matrix, the one or more matrices of the state-space representation being obtained by solving the at least one differential-algebraic equation using the new non-singular mass matrix; and
   saving the model in the storage element.

2. The method of claim 1, wherein the at least a part of the model is an entire model.

3. The method of claim 1, wherein the state-space representation includes:

$\dot{x}=Ax+Bu$ and $y=Cx+Du$, where u is an input vector, y is an output vector, x is a state variable and A, B, C and D are matrices.

4. The method of claim 1, further comprising:
   specifying at least one of a linearization input or a linearization output in the model independent of an input and an output of the model.

5. The method of claim 4, wherein the at least one of a linearization input or a linearization output is specified by a user in the model.

6. The method of claim 1, further comprising:
   generating a report for verifying a property of the model provided by a user using the linearized part of the model.

7. The method of claim 6, wherein the property of the model comprises a stability of the system.

8. The method of claim 1, further comprising:
   sorting entities in the model.

9. The method of claim 1, further comprising:
   assigning computational causality to model entities that represent underlying functionalities of the entities.

10. The method of claim 1, wherein the linearized part of the model is obtained during execution of the model.

11. The method of claim 1, further comprising:
    determining an operating point at which the at least part of the model is linearized from stored values based on a user input.

12. The method of claim 1, wherein the Jacobian comprises first-order partial derivatives of functions with respect to variables of the model.

13. The method of claim 1, further comprising reducing an index of the model to index-1.

14. The method of claim 1, wherein the model comprises a graphical model.

15. The method of claim 14, further comprising:
    replacing a set of entities in the graphical model with at least one entity that is part of a linearized representation of the set of entities and that embodies at least a part of a linearized behavior of the set of entities.

16. A computer-readable storage medium holding instructions for linearizing a model of a system, said instructions comprising:
instructions for obtaining the model of a system, the model including at least one differential-algebraic equation to represent the system, a mass matrix of the model being singular;
instructions for obtaining at least one analytic Jacobian of at least a part of the model;
instructions for linearizing the at least a part of the model using the at least one analytic Jacobian, a state-space representation of the linearized part of the model including one or more matrices;
instructions for using the linearized part of the model to solve at least part of the singular part of the mass matrix;
instructions for using the result of solving the at least part of the singular part of the mass matrix to determine a new non-singular mass matrix, the one or more matrices of the state-space representation being obtained by solving the at least one differential-algebraic equation using the new non-singular mass matrix; and
instructions for saving the model in a storage element.

17. The medium of claim 16, wherein the at least a part of the model is an entire model.

18. The medium of claim 16, wherein the state-space representation includes:

$$\dot{x}=Ax+Bu \text{ and } y=Cx+Du,$$

where u is an input vector, y is an output vector, x is a state variable and A, B, C and D are matrices.

19. The medium of claim 16, further comprising:
instructions for specifying at least one of a linearization input or a linearization output in the model independent of an input and an output of the model.

20. The medium of claim 19, wherein the at least one of a linearization input or a linearization output is specified by a user in the model.

21. The medium of claim 16, further comprising:
instructions for generating a report for verifying a property of the model provided by a user using the linearized part of the model.

22. The medium of claim 21, wherein the property of the model comprises a stability of the system.

23. The medium of claim 16, further comprising:
instructions for sorting entities in the model.

24. The medium of claim 16, further comprising:
instructions for assigning computational causality to model entities that represent underlying functionalities of the entities.

25. The medium of claim 16, wherein the linearized part of the model is obtained during execution of the model.

26. The medium of claim 16, further comprising:
instructions for determining an operating point at which the at least part of the model is linearized from stored values based on a user input.

27. The medium of claim 16, wherein the Jacobian comprises first-order partial derivatives of functions with respect to variables of the model.

28. The medium of claim 16, further comprising:
instructions for reducing an index of the model to index-1.

29. The medium of claim 16, wherein the model comprises a graphical model.

30. The medium of claim 29, further comprising:
instructions for replacing a set of entities in the graphical model with at least one entity that is part of a linearized representation of the set of entities and that embodies at least a part of a linearized behavior of the set of entities.

31. An apparatus for linearizing a model, comprising:
a processor for:
linearizing at least a part of a model using at least one analytic Jacobian of the at least a part of the model, the model including an algebraic equation to represent a system, wherein a mass matrix of the model is singular, a state-space representation of the linearized part of the model including one or more matrices;
using the linearized part of the model to solve at least part of the singular part of the mass matrix;
using the result of solving at least part of the singular part of the mass matrix to determine a new non-singular mass matrix, the one or more matrices of the state-space representation being obtained by solving the at least one differential-algebraic equation using the new non-singular mass matrix; and
a storage element for saving the model.

32. The apparatus of claim 31, wherein the Jacobian comprise first-order partial derivatives of functions with respect to variables of the model.

33. The apparatus of claim 31, wherein the storage element saves the state-space representation as:

$$\dot{x}=Ax+Bu \text{ and } y=Cx+Du,$$

where u is an input vector, y is an output vector, x is a state variable and A, B, C and D are matrices.

34. The apparatus of claim 31, wherein the linear model is analyzed to determine characteristics of the system around an operating point at which the model is linearized.

35. The apparatus of claim 34, wherein the linear model is analyzed to determine a stability of the system around the operating point.

36. The apparatus of claim 31, wherein the system comprises a control system.

37. The apparatus of claim 31, wherein the system comprises a high index system and the high index system is reduced to an index 1 system.

38. The apparatus of claim 31, wherein the model comprises at least one of a graphical model and a text-based model.

39. A computer-implemented device for linearizing a model of a system, said device comprising:
means for obtaining the model of a system, the model including at least one differential-algebraic equation to represent the system, a mass matrix of the model being singular;
means for obtaining at least one analytic Jacobian of at least a part of the model;
means for linearizing the at least a part of the model using the at least one analytic Jacobian, a state-space representation of the linearized part of the model including one or more matrices;
means for using the linearized part of the model to solve at least part of the singular part of the mass matrix;
using the result of solving at least part of the singular part of the mass matrix to determine a new non-singular mass matrix, the one or more matrices of the state-space representation being obtained by solving the at least one differential-algebraic equation using the new non-singular mass matrix; and
means for saving the model in a storage element.

* * * * *

UNITED STATES PATENT AND TRADEMARK OFFICE
CERTIFICATE OF CORRECTION

PATENT NO.         : 7,962,317 B1
APPLICATION NO.    : 11/879351
DATED              : June 14, 2011
INVENTOR(S)        : Joseph Daniel Kanapka Page 1 of 1

It is certified that error appears in the above-identified patent and that said Letters Patent is hereby corrected as shown below:

On the Title Page, Item (73) Assignee, replace "The Math Works, Inc." with
--The MathWorks, Inc.--.

Signed and Sealed this
Eleventh Day of November, 2014

Michelle K. Lee
*Deputy Director of the United States Patent and Trademark Office*